(12) United States Patent
Ivanov et al.

(10) Patent No.: US 8,493,077 B2
(45) Date of Patent: Jul. 23, 2013

(54) ELECTRONIC DEVICE AND METHOD FOR INDUCTOR CURRENT MEASUREMENT

(75) Inventors: Vadim V. Ivanov, Tucson, AZ (US); Juergen Neuhaeusler, Bad Aibling (DE); Frank Vanselow, Attenkirchen (DE)

(73) Assignee: Texas Instruments Deutschland GmbH, Freising (DE)

( * ) Notice: Subject to any disclaimer, the term of this patent is extended or adjusted under 35 U.S.C. 154(b) by 269 days.

(21) Appl. No.: 12/851,909

(22) Filed: Aug. 6, 2010

(65) Prior Publication Data
US 2011/0050250 A1   Mar. 3, 2011

(30) Foreign Application Priority Data
Aug. 14, 2009  (DE) .......................... 10 2009 037 649

(51) Int. Cl.
*G01R 27/28* (2006.01)
(52) U.S. Cl.
USPC ........................................................ 324/654
(58) Field of Classification Search
USPC ........................................................ 324/654
See application file for complete search history.

(56) References Cited

U.S. PATENT DOCUMENTS

| | | | |
|---|---|---|---|
| 5,420,777 A | 5/1995 | Muto | |
| 5,731,731 A | 3/1998 | Wilcox et al. | |
| 6,377,034 B1 | 4/2002 | Ivanov | |
| 6,441,598 B1 * | 8/2002 | Ivanov | 323/284 |
| 6,952,093 B1 * | 10/2005 | Broach et al. | 323/290 |
| 7,756,486 B1 * | 7/2010 | Tan et al. | 455/73 |
| 2008/0265850 A1 | 10/2008 | De Lima Filho | |

FOREIGN PATENT DOCUMENTS

EP    1780881    5/2007

* cited by examiner

*Primary Examiner* — Jeff Natalini
(74) *Attorney, Agent, or Firm* — William B. Kempler; Wade J. Brady, III; Frederick J. Telecky, Jr.

(57) ABSTRACT

An electronic device includes a circuit for measuring a current in an inductor, wherein the current in the inductor is controlled by alternately switching a first power transistor and a second power transistor each having a first electrode, a second electrode and a control gate. The measuring circuit includes a first sense transistor having a first electrode, a second electrode and a control gate, the first sense transistor having the control gate coupled to the control gate of the first power transistor. A second electrode is coupled to the second electrode of the first power transistor. A second sense transistor has a first electrode, a second electrode and a control gate, the second sense transistor having the control gate coupled to the control gate of the second power transistor and having the second electrode coupled to the second electrode of the second power transistor. An amplifier is operable in a first configuration for providing an output current that is a function of a first current though the first sense transistor during a first period of time or in a second configuration for providing the output current as a function of a second current through the second sense transistor during a second period of time, so as to alternately sense a current through the first power transistor with the first sense transistor and through the second power transistor with the second sense transistor.

9 Claims, 4 Drawing Sheets

ELECTRONIC DEVICE AND METHOD FOR INDUCTOR CURRENT MEASUREMENT

CROSS-REFERENCE TO RELATED APPLICATIONS

This patent application claims priority from German Patent Application No. 10 2009 037 649.6, filed Aug. 14, 2009, which is incorporated herein by reference in its entirety.

FIELD OF THE INVENTION

The invention relates to the measurement of inductor current, especially for controlling switching in voltage regulator circuits, as for example DC-DC converters.

BACKGROUND OF THE INVENTION

Many electronic devices, as for example DC-DC converters or devices for controlling electric current motors require accurate measurement of a current through an inductor. A very common approach for measuring a current through an inductor, as for example described in U.S. Pat. Nos. 5,731, 731 B1 and 5,420,777 B1, uses a resistor, which is connected in series to the inductor. However, this conventional solution increases power dissipation and reduces efficiency of the electronic device.

U.S. Pat. No. 6,377,034 B1 describes an approach where sense transistors are used in order to derive a current from currents through power transistors that are equal to the inductor current during respective switching cycles of a buck converter. The circuit is shown in FIG. 1. The circuit 1 is configured to measure current supplied to the inductor 17 by a first transistor 2 and a second transistor 3. The first transistor 2 has a drain coupled to an input voltage conductor 8 (VIN), the gate coupled to the switching signal 4, and the source coupled to the first terminal of an inductor 17. A first sense transistor 7 has a gate and a drain connected to the gate and train, respectively, of the first transistor 2, and a source coupled to a first input of a first amplifier 13 and a drain of a third transistor 12 having a source coupled to a second supply voltage conductor 9, and a gate connected to the gate of a fourth transistor 15. The source of the fourth transistor 15 is connected to the second supply voltage conductor 9 and its drain is connected to an output terminal 18 and a second terminal coupled to the second supply voltage conductor 9. The first transistor 2 and second transistor 3 are included in a DC-DC converter. A second sense transistor 10 has a gate connected to the gate of the second transistor 3 and a drain connected to the drain of the second transistor 3 and to the first terminal of the inductor 17. The source of the second sense transistor 10 is coupled to the output terminal 18. The first and second transistors are operated so that one is on while the other is off, such that the current through the output terminal represents the current through the inductor regardless of which of the first and second transistors supplies the inductor current.

This prior art circuit does not use a series resistor and it allows the inductor current to be precisely determined. However, the circuit is very complex and consumes too much power itself, which adversely affects efficiency of the circuit.

SUMMARY OF THE INVENTION

It is a general object of the invention to provide an electronic device and a method for measuring a current through an inductor which is less complex and consumes less power than prior art circuits.

In one aspect of the invention, an electronic device is provided which includes a circuit for measuring current in an inductor. The current in the inductor is controlled by switching a first power transistor and a second power transistor each having a first electrode, a second electrode and a control gate. The measuring circuit comprises a first sense transistor having a first electrode, a second electrode and a control gate. The first sense transistor is coupled with a control gate to the control gate of the first power transistor and with a second electrode to the second electrode of the first power transistor. The measuring circuit also comprises a second sense transistor having a first electrode, a second electrode and a control gate. The second sense transistor is coupled with the control gate to the control gate of the second power transistor and with the second electrode to the second electrode of the second power transistor. There is an amplifier being either operable in a first configuration or in a second configuration. The amplifier may then be configured to assume the first configuration during a first period of time and the second configuration during a second period of time. The first and second periods of time may be non overlapping clock periods. The amplifier may then either be operable to provide an output current being a function of a first current through the first sense transistor during the first period of time or to provide the output current as a function of a second current through the second sense transistor during a second period of time. This provides that a current through the first power transistor is sensed with the first sense transistor and a current through the second power transistor is sensed with the second sense transistor. The inductor is either supplied through the first power transistor or through the second power transistor. This means that the total inductor current is always correctly sensed, but only with a single amplifier.

In an embodiment, the amplifier may be adapted to pull the voltage level at the first electrode of the first sense transistor to the level at the first electrode of the first power transistor (in the first configuration). The amplifier may be configured to pull the voltage level at the first electrode of the second sense transistor to the voltage level of the first electrode of the second power transistor (in the second configuration). This provides that the voltage levels on all electrodes of the first sense transistor are substantially equal to those of the first power transistor during the first period of time and that the voltage levels on all electrodes of the second sense transistor are substantially equal to those of the second power transistor during the second period of time. A current through the first power transistor can then be easily sensed with the first sense transistor. A current through the second power transistor can be easily sensed with the second sense transistor. According to this aspect of the invention, a configurable amplifier is used for adjusting the voltage levels of the sense transistors. The amplifier can be configured to adjust either of the two voltages. The invention advantageously makes use of the different switching phases (ON phases) for the power transistors. Since either of the transistors is switched on, the transistors can be sensed separately. However, the amplifier is configured to be used for both sense amplifiers. This substantially reduces power consumption and complexity of the circuit.

The amplifier may be a current input amplifier configured to alternately receive the current through the first sense transistor or the current through the second sense transistor and to provide a sense current at an output which is a function of the currents through either the first or the second sense transistor.

In an embodiment, the amplifier may be a current input amplifier, which may then be configurable to be used in the first configuration. The current input amplifier may be configured to be coupled to the second electrode of the first power transistor. The power transistor may be a MOSFET and the second electrode may then be the drain of the power MOSFET. The current input amplifier may comprise a current mirror which is coupled with one side to the drain of the power MOSFET. The other side of the current mirror may then be configured to mirror the potential from the drain of the power MOSFET to the second electrode of the first sense transistor. The first sense transistor may be a MOSFET and the second electrode may be the drain of this MOSFET. The current mirror configuration may then provide that the potential on the drains of the power MOSFET and the sense transistor is substantially the same. The aspect ratios of the power MOSFET and the sense MOSFET may be configured such that the current through the sense MOSFET is a well defined fraction of the current through the power MOSFET.

The amplifier stage may also be configurable to be used in the second configuration. The second power transistor may then be a power MOSFET. The second sense transistor may also be a MOSFET. The second electrodes of the second power transistor and the second sense transistor may then be the drains of both transistors. The current input amplifier may then be coupled between the second electrode of the second power transistor and the second electrode of the second sense transistor. This provides that the potential or voltage level on the second electrode of the sense transistor assumes substantially the same voltage level in the second configuration as the second electrode of the second power transistor. The first configuration may then relate to a switching phase during which the first power transistor is turned on (conducting) and the second power transistor is turned off. The second configuration may then relate to a switching phase during which the second power transistor is turned on and the first power transistor is turned off.

The invention also provides a method of measuring a current in an inductor, which is controlled by switching a first power transistor and a second power transistor. The method may be a method of operating an electronic device, as for example a DC-DC converter in particular a buck, boost or buck/boost converter. A first current through the first power transistor may be sensed with a first sense transistor during a first period of time. A second current through the second power transistor may be sensed with a second sense transistor during a second period of time. An amplifier may be used in a first configuration for providing an output current, which is a function of the first current during the first period of time. The amplifier may then be used in a second configuration for providing the output current as a function of the second current during the second period of time. This provides that only one amplifier can be used for sensing two currents indicating in combination the total inductor current.

The amplifier may also be configured and used in the first configuration for adjusting a voltage level at an electrode of the first sense transistor during the first period of time. Furthermore, the amplifier may be configured and used in the second configuration for adjusting a voltage level at an electrode of the second sense transistor during the second period of time. This provides that the same amplifier can be used for consecutively adjusting voltage levels of the first sense transistor and the second sense transistor. The complexity of the circuit is reduced and the precision of the measurement is high.

BRIEF DESCRIPTION OF THE DRAWINGS

Further aspects of the invention will ensue from the description herein below of preferred embodiments of the invention with reference to the accompanying drawings, wherein.

DESCRIPTION OF THE EMBODIMENTS

Figure 1:
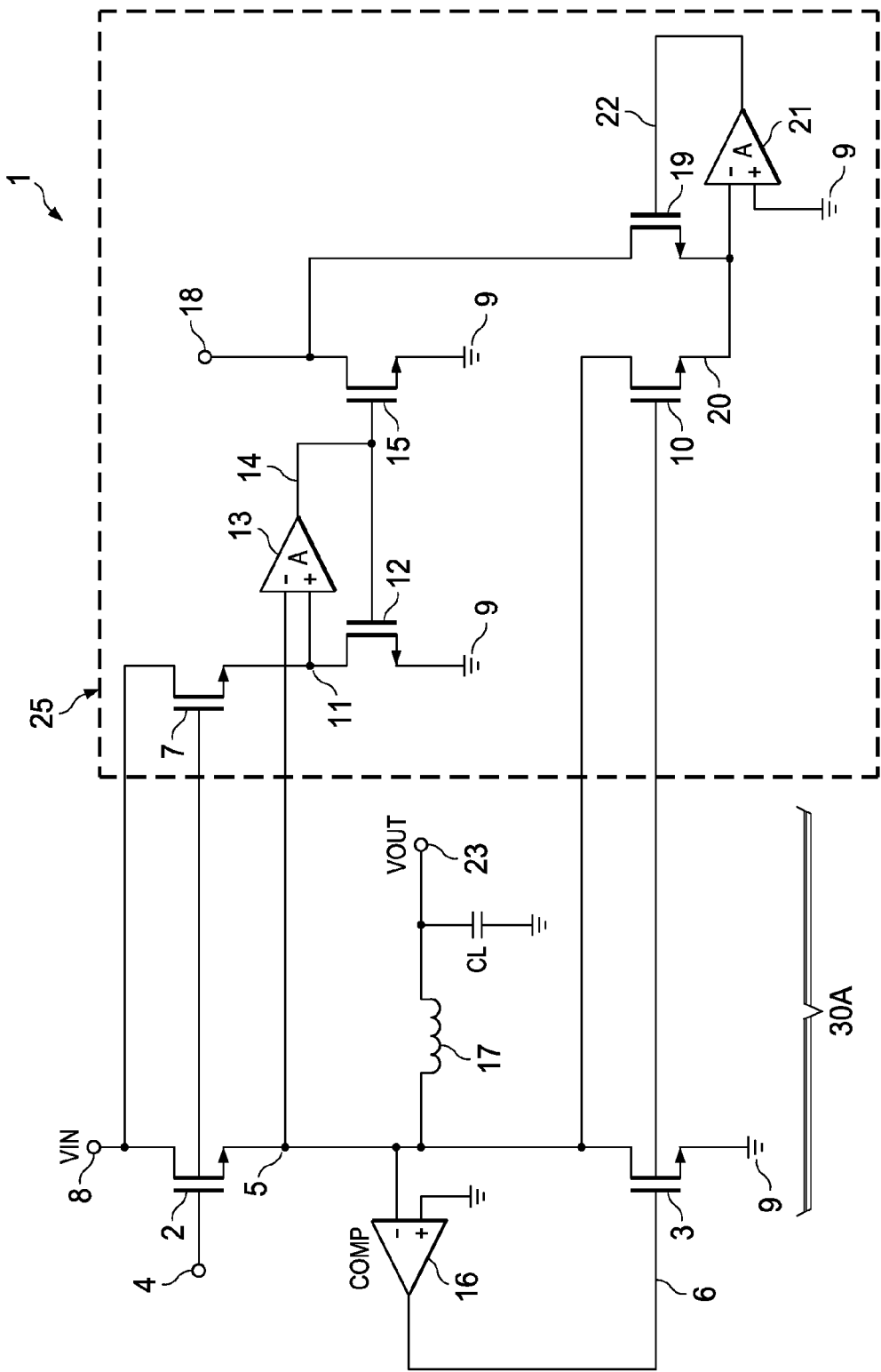
FIG. 1 shows a simplified circuit diagram of a circuit for measuring a current through an inductor according to the prior art.
Figure 2:
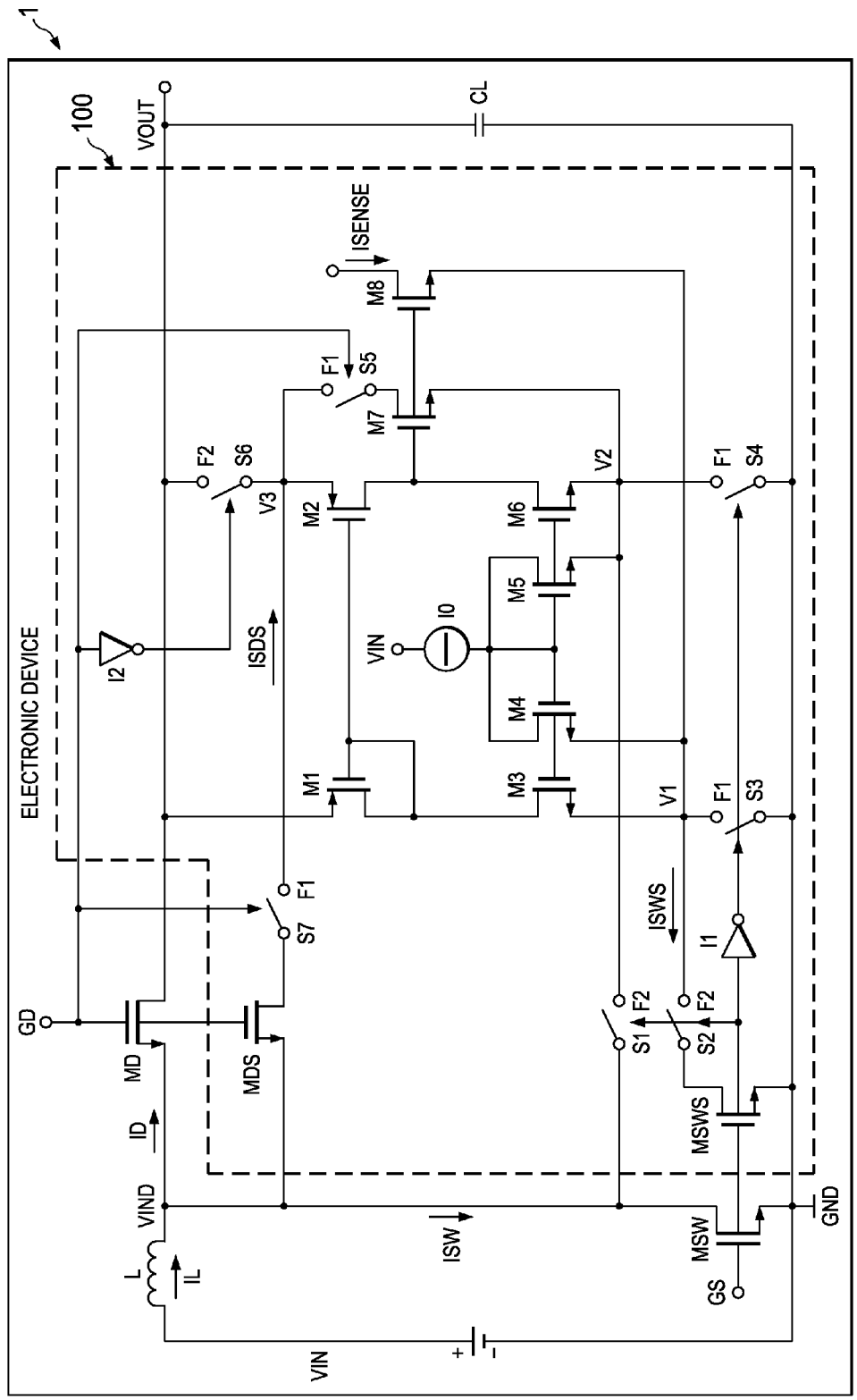
FIG. 2 shows a simplified circuit diagram of an electronic device for boost conversion according to an embodiment of the invention.

FIG. 2 shows a simplified circuit diagram of an electronic device 1 for boost conversion according to an embodiment of the invention. The electronic device may be an integrated electronic device, as, for example an integrated semiconductor circuit for DC-DC conversion, and in particular a boost converter. Some parts of the electronic device may not be integrated as for example the inductor L or the buffer capacitor CL. The primary voltage supply VIN may be externally applied to the device. The power transistors MD and MSW may either be integrated or external. The output voltage VOUT is derived from the input voltage VIN through DC-DC conversion. This is performed with power switches MD and MSW. The two switches are power MOSFETs in this embodiment. The reference sign MD relates to the fact that this MOSFET can be replaced with a diode. The other transistor MSW may also be referred to as the main switch. The two transistors MD and MSW are alternately switched on and off with control signals GD and GS which are applied to the control gates of the transistors. The signals may be generated in a control stage and buffered in a gate driver, which are both not shown. The control stage and the gate driver may also be integrated on the electronic device 1. Signals GD and GS may be non overlapping clock signals. Signals GD and GS may also be pulse width modulated for adjusting and controlling the output voltage level and/or the inductor current IL. Transistors MDS and MSWS are the first and the second sense transistor. The sense transistors are used for sensing the currents through the respective power transistor MD and MSW. The circuit 100 is configured to provide a sense current ISENSE, which is proportional to the current IL through the inductor L. The current IL through the inductor L is equal to either the current through the first power transistor MD or the second power transistor MSW as only one of the two transistors is switched on at the same time.

The control gate of the first sense transistor MDS also receives the driving signal GD for the first power transistor MD. The sources of transistors MD and MDS are both coupled to one side of the inductor L, i.e. node VIND. The drain of power transistor MD provides the output voltage VOUT. The control gate of the second sense transistor MSWS is also driven with the driving signal GS used for the second power transistor MSW. The sources of MSW and MSWS are both coupled to ground. The drain of transistor MSW is coupled to node VIND, i.e. to the sources of transistors MD, and MDS as well as to one side of the inductor L. This means that the sense transistors MDS and MSWS and their respective power transistors MD and MSW are coupled together at their control gates and their sources. The drains of the sense transistors MDS and MSWS are coupled through switch S7 and S2 to an amplifier.

The amplifier includes transistors M1, M2, M3, M4, M5, M6, M7 and M8 and switches S1 to S7. The amplifier is configurable through the switches. The amplifier is generally configured to assume a first configuration and a second configuration. The first configuration is assumed during a first period of time during which all switches annotated with F1 are closed (conducting) and switches with F2 are open (not conducting). During the second period of time all switches annotated with F2 are closed (conducting) and the other switches with F1 are open (not conducting).

The basic stage of the current amplifier includes transistors M3, M4, M5, M6 and current source I0. All transistors M3 to M6 may have the same dimensions (i.e. for example the same width to length ratio of their channels). This provides that each transistor M3 to M6 has the same drain current ID=I0/2. The current amplifier stage further includes a current mirror M1, M2, transistors M7 and M8 as well as switches S1 to S7.

In the first configuration, the amplifier serves to generate a voltage at the drain of sense transistor MDS (node V3) which is close or equal to the actual output voltage VOUT at the drain of power transistor MD. The amplifier pulls the voltage level at node V3 closer to the output voltage level VOUT. In the second configuration, the amplifier serves to generate a voltage at the drain of sense transistor MSWS (node V1) which is equal to the voltage at the drain (node V2) of power transistor MSW, i.e. voltage VIND. This means that in the first configuration, the first sense transistor MDS receives the same voltage levels at drain (V3≈VOUT), source (VIND) and control gate (GD) as the power transistor MD. Therefore, the current through MDS is a well defined function of (it can, for example be proportional to) the current through the power transistor. The current through the sense transistor MDS can then be a function of the aspect ratios (channel width to channel length) of transistors MD and MDS. In the second configuration, the current through power transistor MSWS is proportional to the current through power transistor MSW. The current through the sense transistor MDS is a function of the aspect ratios (channel width to channel length) of transistor MSW and MSWS.

The amplifier includes transistors M1 to M8. Transistor M1 is coupled with its source to VOUT. Control gate and drain of transistor M1 are coupled together (diode coupled) and to the drain of transistor M3. The gate of transistor M1 is coupled to the gate of transistor M2. The source of transistor M2 is coupled to node V3. Node V3 is coupled to one side of switch S6. The other side of switch S6 is coupled to VOUT. The drain of transistor M2 is coupled to the drain of transistor M6. The gates of transistors M3, M4, M5 and M6 are coupled together. The drain of transistor M6 is coupled to the drain of transistor M2. The source of transistor M6 is coupled to node V2. The drains and gates of transistors M4 and M5 are coupled together and to a current source I0. The source of transistor M4 is coupled to node V1 and the source of transistor M5 is coupled to node V2. The source of transistor M3 is also coupled to node V1. Node V1 is coupled to switches S3 and S2 for either being switched to the drain of sense transistor MSWS or to ground. Node V2 is coupled to switches S1 and S4 for either being switched to the drain of power transistor MSW (node VIND) or to ground. Switches S1 and S2 are driven with the gate driving signal GS of power transistor MSW whereas switches S3 and S4 are driven with the inverted driving signal GS. This means that either switches S1, S2 or switches S3, S4 are conducting. An inverter I1 may be provided for generating the inverted signal GS. Switches S7 and S8 are driven with the gated driving signal GD of power transistor MD. The inverted gate driving signal GD is used for driving switch S6. This means that either switches S7 and S8 or switch S6 are conducting. An inverter I2 may be provided for generating the inverted gate driving signal GD for switch GD. Furthermore, there are transistors M7 and M8 having their control gates coupled to the drains of transistors M2 and M6. The drain of transistor M7 is coupled to switch S5 for being selectively coupled to node V3. The source of transistor M7 is coupled to node V2, i.e. either to the drain of power transistor MSW through switch S1 or to ground through switch S4. The drain of transistor M8 is coupled to node V1, i.e. either to the drain of sense transistor MSWS through switch S2 or to ground through switch S3. The drain of transistor M8 provides the sense current ISENSE which is a function of (for example proportional to) the current through the inductor L.

The amplifier is configured to provide that either the current through MDS, which is proportional to the current through MD or the current through MSWS, which is proportional to the current through MSW is used to define current ISENSE through transistor M8. Current ISENSE can then be used as an indicator for the magnitude of the current through the inductor, as it is either a function of (or even proportional to) the current through power transistor MD or the current through power transistor MSW. As only one of the power transistors MD or MSW is switched on, the currents through the transistors indicate the current through the inductor L.

The amplifier operates as a current input amplifier. In the first configuration (phase F1), current minor M1, M2 is coupled between node V3 and VOUT. Switches S3, S4, S5 and S7 are closed (conducting). Switches S1, S2 and S6 are open (not conducting). Current ISDS, which is substantially proportional to current ID through transistor MD, is fed to transistor M7 and from there to ground. However, ID is equal to the current IL through the inductor L, since power switch MSW is turned off (not conducting). Since the voltage levels at nodes V1 and V2 are equal and coupled to ground through switches S3, S4, the current ISENSE through transistor M8 can be a well defined function of the current ISDS through M7. The current ISENSE through M8 may be proportional to the current ISDS through M7. If current IL increases, also current ID and current ISDS will increase. The additional current causes that the voltage level at the control gate of transistor M7 increases and transistors M7 and M8 increase their drain currents until the drain current M6 is I0/2. This control mechanism is used for providing that the current through M8 is a function of (e.g. proportional to) the inductor current IL.

In the second configuration (phase F2), node V3 is coupled to VOUT. Transistor M7 is decoupled from node V3 by switch S5. Nodes V1 and V2 (i.e. the sources of transistors M3 to M6) are coupled to the drains of transistors MSWS and MSW respectively. The current ISWS through sense transistor MSWS is a function of the current ISW through power transistor MSW. The power transistor MSW and the sense transistor MSWS both receive half the bias current I0 (I0/2). The variable portion of the current through MSW is ISW. The variable portion of the current through MSWS is ISENSE. The current mirror configuration with transistors M3, M4, M5, M6 and transistors M1, and M2 provides that the voltage level on node V1 is mirrored to node V2 and that the drains of transistors MSW and MSWS have the same voltage level. ISENSE then reflects the magnitude and variations of current ISW. However, ISW is equal to the current IL through the inductor L.

The current amplifier stage 100 provides at least a first node (V3) which assumes a first voltage level in the first configuration and at least a second node (V1) which assumes a second voltage level in the second configuration. The voltage level at the first node changes in the second configuration. The voltage level at the second node changes in the first configuration. The first node is coupled to a supply voltage level in the second configuration (in this embodiment it is the positive supply voltage level, the output voltage VOUT). The second node is coupled to a supply voltage level (in this embodiment it is a negative supply voltage level, ground GND) in the first configuration. This means that the first node and the second node can be located on opposite first and second sides (for example a first side coupled to the positive supply voltage level and a second side coupled to the negative supply voltage level) of the current amplifier.

Figure 3:
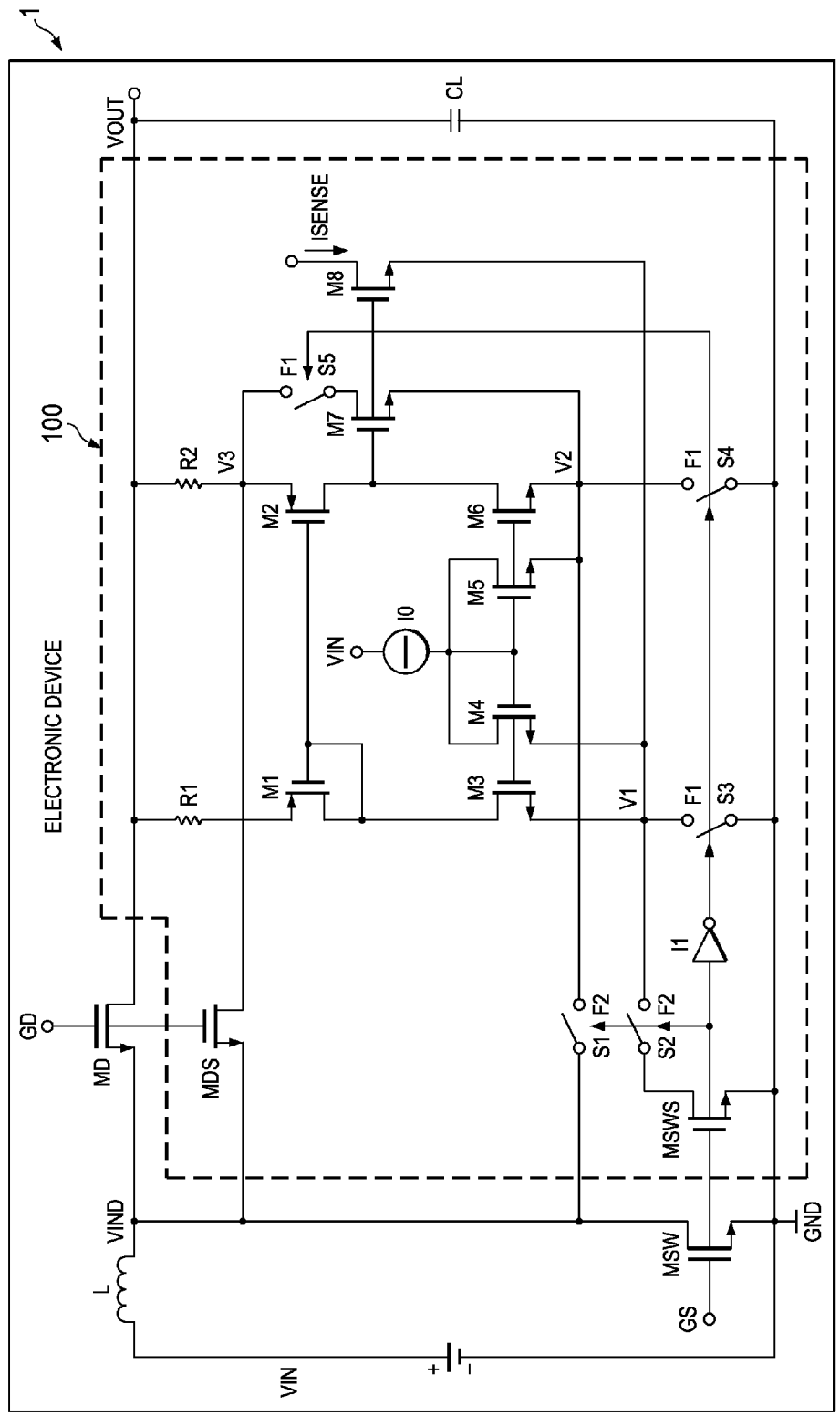
FIG. 3 shows some modifications of the embodiment of FIG. 2.

FIG. 3 shows a simplified circuit diagram of another embodiment of the invention. The electronic device 1 may include a circuit 100 which is basically similar to the circuit 100 shown in FIG. 2. Parts and components with the same reference signs have the same functionality as in FIG. 3. However, this embodiment is configured to operate without the switches S7 and S6 shown in FIG. 2. The switching operation and timing of switches S6 and S7 may be particularly demanding and difficult to adjust. It may therefore be advantageous to couple resistors R1 and R2 between VOUT and the drains of transistors M1 and M2, respectively. Switches S7 and S6 may then be omitted. Even without switches S6, S7, circuit 100 operates as previously described and the current ISENSE can still be a function of the inductor current IL.

Figure 4:
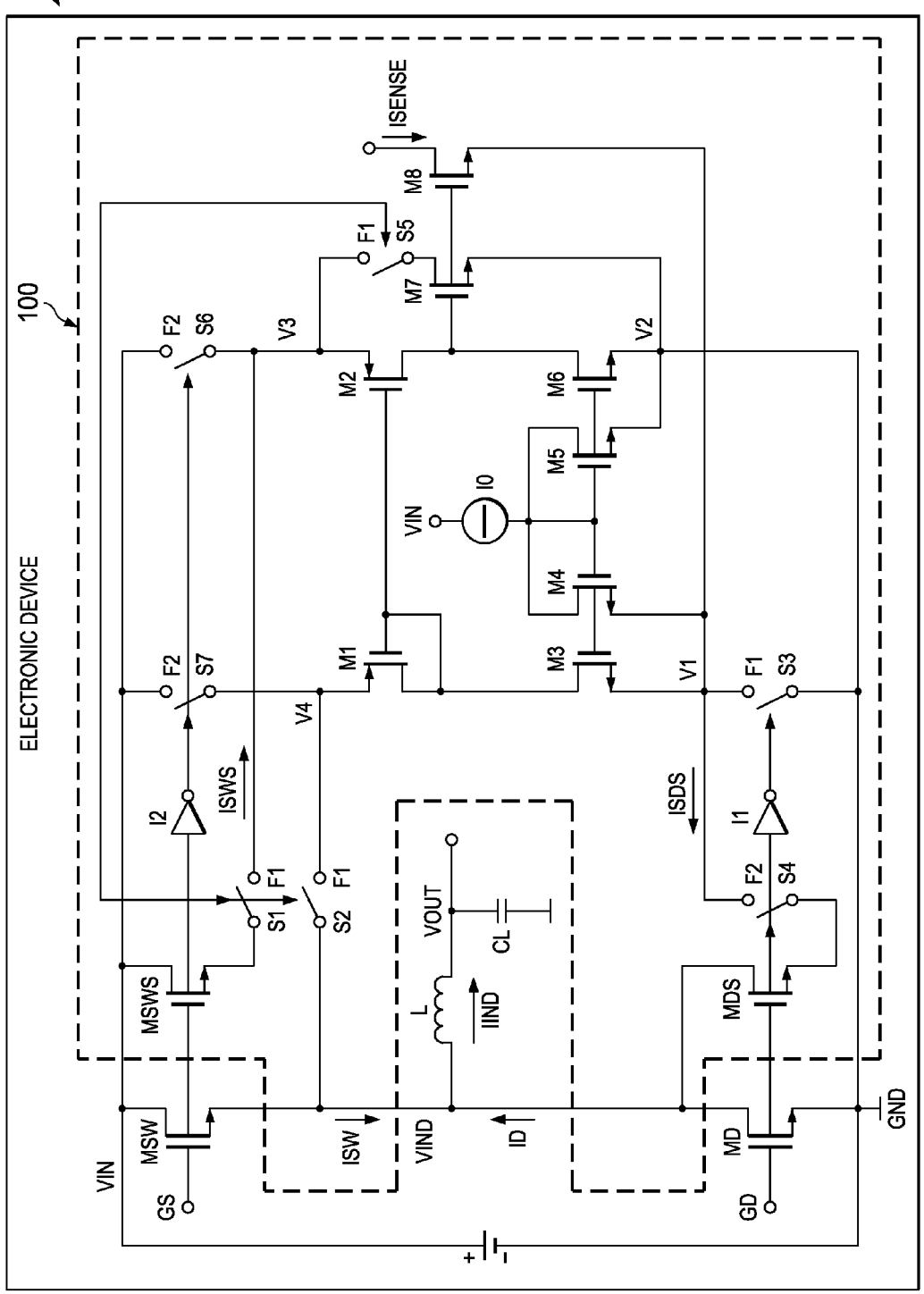
FIG. 4 shows a simplified circuit diagram of an electronic device for buck conversion according to an embodiment of the invention.

FIG. 4 shows a simplified circuit diagram of an electronic device 1 for buck conversion according to an embodiment of the invention. The electronic device 1 may be an integrated electronic device, as, for example an integrated semiconductor circuit for DC-DC conversion, in particular a buck converter. Some parts of the electronic device may not be integrated as for example the inductor L or the buffer capacitor CL. The primary voltage supply VIN may be externally applied to the device. The power transistors MD and MSW may either be integrated or external. Similar to the embodiments of FIG. 2 and FIG. 3, the two transistors MD and MSW are alternately switched on and off with control signals GD and GS which are applied to the control gates of the transistors. The electronic device 1 may also include respective control and driving stages for generating signals GD and GS, which are not shown. The driving signals GS and GD may be non-overlapping clock signals having the same clock frequency. They may be modulated according to a pulse width modulation scheme for adjusting and controlling the output voltage level VOUT and/or the inductor current IIND. The circuit 100 operates basically similar to the circuit 100 of FIG. 2 and FIG. 3.

Transistor M1 is either coupled with its source to VIN or to VIND. Control gate and drain of transistor M1 are coupled together (diode coupled). The drain of transistor M1 is also coupled to the drain of transistor M3. The gate of transistor M1 is coupled to the gate of transistor M2. The source of transistor M2 is coupled to node V3. Node V3 is coupled to a switch S6 the other side of which is coupled to VIN. The drain of transistor M2 is coupled to the drain of transistor M6. The gates of transistors M3, M4, M5 and M6 are coupled together. The drain of transistor M6 is coupled to the drain of transistor M2. The source of transistor M6 is coupled to node V2. The drains and gates of transistors M4 and M5 are coupled together and to a current source M. The source of transistor M4 is coupled to node V1 and the source of transistor M5 is coupled to node V2. The source of transistor M3 is also coupled to node V1. Node V1 is coupled to switches S3 and S4 for either being switched to the source of sense transistor MDS or to ground. Node V2 is coupled to ground GND. Switches S1, S2 and S5 are driven with the gate driving signal GS of power transistor MSW whereas switches S6 and S7 are driven with the inverted driving signal GS. An inverter I1 may be provided for generating the inverted driving signal. Switch S4 is driven with the driving signal GD for power transistor MD. The inverted gate driving signal GD is used for driving switch S3. An inverter I2 may be provided for generating the inverted gate driving signal. Furthermore, there are transistors M7 and M8 having their control gates coupled to the drains of transistors M2 and M6. The drain of transistor M7 is coupled to switch S5 for being selectively connected to node V3 during phase F1. The source of transistor M7 is coupled to node V2, i.e. either to the drain of power transistor MSW through switch S1 or to ground through switch S4. The drain of transistor M8 is coupled to node V1, i.e. either to the source of sense transistor MDS through switch S4 or to ground through switch S3. The drain of transistor M8 provides the sense current ISENSE which can be configured to be a function of (for example proportional to) the current IIND through the inductor L.

Transistors MDS and MSWS are the first and the second sense transistors and they are configured to sense the currents through the respective power transistor MD and MSW. The circuit 100 is generally configured to provide a sense current ISENSE, which is proportional to the current IIND through the inductor L, which is equal to either the current through the first power transistor MD or the second power transistor MSW, only one of which is switched on at the time. The electronic device converts the input voltage VIN into the output voltage VOUT which is buffered on capacitor CL.

The control gate of the first sense transistor MDS also receives the driving signal GD for the first power transistor MD. The drains of transistors MD and MDS are both coupled to one side of the inductor L, i.e. node VIND. The source of power transistor MD is coupled to ground GND. The control gate of the second sense transistor MSWS is also driven with the driving signal GS used for the second power transistor MSW. The drains of MSW and MSWS are both coupled to VIN. The source of transistor MSW is coupled to node VIND, i.e. it is also coupled to the drains of transistors MD and MDS, as well as to one side of the inductor L. This means that the sense transistors MDS and MSWS and their respective power transistors MD and MSW are coupled together at their control gates and their drains. The sources of the sense transistors MDS and MSWS and the source of power transistor MSW can be selectively coupled through switches S4, S1 and S2 to the current input amplifier.

The amplifier includes transistors M1, M2, M3, M4, M5, M6, M7 and M8 and switches S1 to S7. The amplifier is configurable through switches S1 to S7. The amplifier is configured to assume a first configuration during a phase F1 and a second configuration during a phase F2 as previously described.

During phase F1, switches S1, S2, S3 and S5 are conducting and power transistor MSW and sensing transistor MSWS are turned on (signal GS is high and signal GD is low). Transistors M3, M4, M5 and M6 are biased with current source I0. Each transistor M3 to M6 has a drain current I0/2. This drain current also flows through transistors M1 and M2 (current minor) and through transistors MSW and MSWS. The voltage levels on nodes V3 and V4 are basically equal. This means that transistors MSW and MSWS have the same voltage levels on drain, gate and source during phase F1. If the inductor current IIND through the inductor L increases, the current ISW through MSW, and the current ISWS through MSWS increases, too. Transistors M3 and M6 are biased to a drain current of I0/2. If more current is supplied to M2 and M6, the additional current flows through transistor M7. The gate voltage of transistor M7 rises if current ISWS increases and falls if current ISWS decreases. Transistor M8 has the same source and gate voltage as transistor M7. Therefore, the drain current ISENSE of transistor M8 is a function (e.g. proportional) to the inductor current IIND.

In the second configuration during phase F2, the current through transistor MD is sensed with transistor MDS and the same current amplifier comprising transistors M1 to M8 and switches S1 to S7. In phase F2, switches S1, S2, S3 and S5 are not conducting and switches S4, S6 and S7 are conducting. The inductor current IIND is now supplied by transistor MD as a current ID. The current ID flows from ground to VIND and then through the inductor L. The voltage levels V1 and V2 on the lower side of the current amplifier are now basically equal. The quiescent value of current ISDS (and therefore also of ISENSE) is I0. If IIND rises, ID also rises. This causes an increase of the gate voltage of transistor M8 and therefore an increasing ISENSE. If IIND falls, the gate voltage of transistor M8 also falls and ISENSE is decreased. Therefore, also during phase F2, the drain current ISENSE of transistor M8 is a function (e.g. proportional) to the inductor current IIND. The current through the sense transistors MDS, MSWS, and therefore the sense current ISENSE can then be a function of the aspect ratios (channel width to channel length) of transistors MD, MSW and MDS, MSWS, respectively.

The current amplifier is configured to provide that either the current through MDS, which is proportional to the current through MD or the current through MSWS, which is proportional to the current through MSW is used to define current ISENSE through transistor M8. Current ISENSE can then be used as an indicator for the magnitude of the current through the inductor, as it is either a function of (or even proportional to) the current through power transistor MD or the current through power transistor MSW. As only one of the power transistors MD or MSW is switched on, the currents through the transistors indicate the current through the inductor L.

Although the present invention has been described in detail, it should be understood that various changes, substitutions and alterations can be made thereto without departing from the spirit and scope of the invention as defined by the appended claims.

The invention claimed is:

1. An electronic device including a circuit for measuring a current in an inductor, wherein the current in the inductor is controlled by alternately switching a first power transistor and a second power transistor each having a first electrode, a second electrode and a control gate, the measuring circuit comprising:
    a first sense transistor having a first electrode, a second electrode and a control gate, the first sense transistor having the control gate coupled to the control gate of the first power transistor and a second electrode coupled to the second electrode of the first power transistor;
    a second sense transistor having a first electrode, a second electrode and a control gate, the second sense transistor having the control gate coupled to the control gate of the second power transistor and having the second electrode coupled to the second electrode of the second power transistor; and
    a single amplifier being operable in a first configuration, wherein the single amplifier is switched only to the first sense transistor for providing an output current that is a function of a first current though the first sense transistor during a first period of time or being operable in a second configuration, wherein the single amplifier is only switched only to the second sense transistor for providing the output current as a function of a second current through the second sense transistor during a second period of time, so that the single amplifier alternately senses a current through the first power transistor with the first sense transistor and through the second power transistor with the second sense transistor.

2. The electronic device according to claim 1, wherein the amplifier is configured in the first configuration to pull the voltage level at the first electrode of the first sense transistor to the level at the first electrode of the first power transistor and in the second configuration to pull the voltage level at the first electrode of the second sense transistor to the voltage level of the first electrode of the second power transistor.

3. The electronic device according to claim 2, wherein the amplifier is a current input amplifier configured to alternately receive the current through the first sense transistor or the current through the second sense transistor and to provide a sense current at an output which is a function of the currents through either the first or the second sense transistor.

4. The electronic device according to claim 1, wherein the amplifier is a current input amplifier configured to alternately receive the current through the first sense transistor or the current through the second sense transistor and to provide a sense current at an output which is a function of the currents through either the first or the second sense transistor.

5. A method of measuring a current in an inductor, wherein the current in the inductor is controlled by switching a first power transistor and a second power transistor, the method comprising:
    sensing a first current through the first power transistor with a first sense transistor during a first period of time;
    sensing a second current through the second power transistor with a second sense transistor during a second period of time;
    providing an output current using a single amplifier in a first configuration wherein the single amplifier is switched only to the first sense transistor the output current being a function of the first current during the first period of time and providing the output current using the single amplifier in a second configuration, wherein the single amplifier is switched only to the second sense transistor the output current being a function of the second current during the second period of time.

6. The method according to claim 5, further comprising: using the amplifier in the first configuration for adjusting a voltage level at an electrode of the first sense transistor during the first period of time and using the amplifier in the second configuration for adjusting a voltage level at an electrode of the second sense transistor during the second period of time.

7. The method according to claim 6, comprising:
    alternately receiving current through the first sense transistor by the amplifier;
    alternately receiving current through the second sense transistor by the amplifier; and
    providing a sense current at an output which is a function of the currents through either the first or second sense transistors.

8. The method according to claim 5, comprising:
    alternately receiving current through the first sense transistor by the amplifier;
    alternately receiving current through the second sense transistor by the amplifier; and
    providing a sense current at an output which is a function of the currents through either the first or second sense transistors.

9. A DC to DC converter having an output voltage that differs from an input voltage by alternately switching a first power transistor and a second power transistor each having a first electrode, a second electrode and a control gate to control the current through an inductor and having a measuring circuit comprising:
- a first sense transistor having a first electrode, a second electrode and a control gate, the first sense transistor having the control gate coupled to the control gate of the first power transistor and a second electrode coupled to the second electrode of the first power transistor;
- a second sense transistor having a first electrode, a second electrode and a control gate, the second sense transistor having the control gate coupled to the control gate of the second power transistor and having the second electrode coupled to the second electrode of the second power transistor; and
- a single amplifier being operable in a first configuration wherein the single amplifier is switched only to the first sense transistor for providing an output current that is a function of a first current though the first sense transistor during a first period of time or being operable in a second configuration wherein the single amplifier is switched only to the second sense transistor for providing the output current as a function of a second current through the second sense transistor during a second period of time, so that the single amplifier alternately senses a current through the first power transistor with the first sense transistor and through the second power transistor with the second sense transistor; and
- wherein the amplifier is a current input amplifier configured to alternately receive the current through the first sense transistor or the current through the second sense transistor and to provide a sense current at an output which is a function of the currents through either the first or the second sense transistor.

* * * * *